US007333771B2

(12) United States Patent
Maxwell

(10) Patent No.: US 7,333,771 B2
(45) Date of Patent: Feb. 19, 2008

(54) MOUNTING PEDESTAL FOR A CELLULAR SIGNAL ENHANCER

(75) Inventor: James William Maxwell, Atlanta, GA (US)

(73) Assignee: Andrew Corporation, Westchester, IL (US)

( * ) Notice: Subject to any disclaimer, the term of this patent is extended or adjusted under 35 U.S.C. 154(b) by 189 days.

(21) Appl. No.: 11/127,668

(22) Filed: May 12, 2005

(65) Prior Publication Data

US 2006/0205348 A1 Sep. 14, 2006

Related U.S. Application Data

(60) Provisional application No. 60/660,928, filed on Mar. 11, 2005.

(51) Int. Cl.

| | |
|---|---|
| ***H04B 7/14*** | (2006.01) |
| ***H04B 7/15*** | (2006.01) |
| ***H04B 1/38*** | (2006.01) |
| ***H05K 7/02*** | (2006.01) |
| ***H05K 7/10*** | (2006.01) |

(52) U.S. Cl. ....................... 455/15; 455/402; 455/11.1; 455/90.3; 361/807; 361/808

(58) Field of Classification Search ................ 455/402, 455/11.1, 90.3; 361/807, 808

See application file for complete search history.

(56) References Cited

U.S. PATENT DOCUMENTS

| | | | | |
|---|---|---|---|---|
| 5,905,442 | A * | 5/1999 | Mosebrook et al. | 340/3.7 |
| 6,078,033 | A * | 6/2000 | Bowers et al. | 219/662 |
| 6,125,109 | A * | 9/2000 | Fuerter | 370/315 |
| 6,339,694 | B1 * | 1/2002 | Komara et al. | 455/11.1 |
| 6,370,037 | B1 * | 4/2002 | Schoenfish | 361/807 |
| 6,745,003 | B1 * | 6/2004 | Maca et al. | 455/11.1 |
| 6,934,511 | B1 * | 8/2005 | Lovinggood et al. | 455/11.1 |
| 2001/0021659 | A1 * | 9/2001 | Okamura | 455/557 |
| 2001/0048584 | A1 * | 12/2001 | Rosen | 361/681 |
| 2001/0048593 | A1 * | 12/2001 | Yamauchi et al. | 361/807 |
| 2003/0034166 | A1 * | 2/2003 | Castellani et al. | 174/48 |
| 2003/0199247 | A1 * | 10/2003 | Striemer | 455/11.1 |
| 2003/0220074 | A1 * | 11/2003 | Wee et al. | 455/11.1 |
| 2003/0232595 | A1 * | 12/2003 | Baker et al. | 455/11.1 |
| 2004/0017479 | A1 * | 1/2004 | Nakakubo et al. | 348/207.99 |
| 2004/0047335 | A1 * | 3/2004 | Proctor et al. | 370/351 |
| 2004/0116149 | A1 * | 6/2004 | Yukie et al. | 455/550.1 |
| 2004/0166802 | A1 * | 8/2004 | McKay et al. | 455/15 |
| 2006/0283617 | A1 * | 12/2006 | McMahon et al. | 174/50 |

* cited by examiner

*Primary Examiner*—Lana Le
*Assistant Examiner*—Bobbak Safaipour
(74) *Attorney, Agent, or Firm*—Michael J. Mehrman; Mehrman Law Office, PC

(57) ABSTRACT

A relatively low cost, easy to install and aesthetically pleasing cellular signal enhancer, also known as a wireless repeater, suitable for use in a home or business. The device includes a removable mounting pedestal that can be plugged into both an upper and a lower receptacle on a signal enhancer unit. This allows the signal enhancer unit to be installed with the same upright orientation when installed on an upper or a lower support surface, for example the bottom or top casing of a window frame. The mounting pedestal includes a power plug so that the mounting pedestal is removable and can be plugged into the upper or lower receptacles on the signal enhancer unit. Alternatively, the unit may include an orientation detector and an invertible display that inverts the symbols shown on the display in response to the detected orientation of the signal enhancer unit.

12 Claims, 6 Drawing Sheets

MOUNTING PEDESTAL FOR A CELLULAR SIGNAL ENHANCER

REFERENCE TO RELATED APPLICATIONS

This application claims priority to commonly-owned U.S. Provisional Patent Application Ser. No. 60/660,928 entitled “Improved Cellular Signal Enhancer” filed Mar. 11, 2005, which is incorporated herein by reference. This application also incorporates by reference commonly-owned U.S. patent application Ser. No. 10/375,879 entitled “Cellular Signal Enhancer” filed Feb. 26, 2003.

TECHNICAL FIELD

The present invention is generally related to cellular signal enhancers, which are also known as wireless repeaters. More particularly, the invention relates to a mounting system that is easy to install with ordinary tools, aesthetically pleasing, and facilitates installing the cellular signal enhancer in different orientations to accommodate a wide range of customers.

BACKGROUND OF THE INVENTION

Cellular signal enhancers, also known as wireless repeaters, serve an important function in the cellular telephone industry, as described in detail in U.S. patent application Ser. No. 10/375,879 referenced above. They receive, amplify and repeat bidirectional wireless telephone signals between cellular base stations and wireless telephones located in a structure, typically a home or office, where low signal strength from the base station causes degraded service or, in some cases, no service at all. In addition, low signal strength causes the wireless telephone to increase its transmission power, which drains the battery more quickly. This makes the wireless repeater an important, if not indispensable, piece of equipment for a wide range of customers, including the increasing number of customers who rely on wireless telephone service exclusively and, therefore, do not have a land line alternative available in their homes or businesses. Sufficiently reliable wireless telephone service is also especially important for those who rely on wireless telephone service for data communications, such as Internet access, credit card transactions, intranet communications with a remote office location, and the like.

Because wireless repeaters are typically designed to be installed by the customers, preferably in a window, it is desirable for the units to be easy to install and orient in the direction that provides the best service. It is also desirable for the mounting system to be aesthetically pleasing and sufficiently versatile to be easily installed in different orientations to accommodate various customers. It is further desirable for the mounting system to obtain these advantages without interfering with other aspects of the wireless repeater, such as the display of status information. It is further desirable for the mounting system to be inexpensive to manufacture, inexpensive and easy to install with ordinary tools, and sufficiently secure once installed. Conventional mounting systems for wireless repeaters fail to meet all of these objectives. Accordingly, there is an ongoing need for a mounting system for a cellular signal enhancer which. meets these needs.

SUMMARY OF THE INVENTION

The present invention meets the needs described above in a swiveling mounting pedestal for a cellular signal enhancer that is easily installed to support surfaces having different orientations. The pedestal includes removable covers to facilitate installing and adjusting the swivel of the unit. The pedestal also internally routes the power cable for the cellular signal enhancer unit to produce an aesthetically pleasing appearance. In certain embodiments, the pedestal includes a power plug that is removable from the unit to further facilitate installation of the unit. The cellular signal enhancer may also include multiple receptacles to receive the mounting pedestal on different sides of the unit so that the unit can have the same orientation when installed on support surfaces having different orientations, such as an upper or lower window casing. Alternatively, the unit may include an orientation detector and an invertible display to allow the display to be shown right-side-up when the unit is installed right-side-up or upside-down.

The housing for the mounting pedestal is preferably manufactured from plastic components that can be mass produced cost effectively, and the unit can be installed with an ordinary drill and screwdriver. The same mounting pedestal can also be used on a cellular signal enhancer with different configurations. The resulting mounting pedestal is easy to install and swivel, rugged, versatile, cost effective and aesthetically pleasing. Other advantages will also become apparent from the following description and the attached figures.

Generally described, the invention may be implemented as a cellular signal enhancer that includes a signal enhancer unit and a mounting pedestal for attaching the signal enhancer unit to a support surface, such as a window casing. The invention may also be implemented in a removable mounting pedestal for the signal enhancer unit. In this embodiment, the signal enhancer unit includes an upper power receptacle and a lower power receptacle on upper and lower sides of the unit, respectively. The mounting pedestal includes a power plug that connects to a power cord that is routed through the pedestal housing. The pedestal housing is configured to support the signal enhancer unit in its. upright orientation from above with the power plug received within the upper power receptacle, and is also configured to support the signal enhancer unit in the upright orientation from below with the power plug received within the lower power receptacle.

The signal enhancer also includes a swivel connection between the power plug and the pedestal housing, to permit swiveling of the signal enhancer unit after the mounting pedestal has been installed. To avoid internal wiring, the upper and lower power receptacles may be mounted directly to an electronics board within the signal enhancer unit. In addition, the pedestal housing typically includes a mounting plate and one removable cover that facilitates attaching the mounting pedestal to a support surface and changing a swivel angle of the signal enhance unit. The power cord may also be routed from the power plug, through the housing, and through an opening between the mounting plate and the cover to produce an aesthetically pleasing appearance.

Another embodiment includes a signal enhancer unit that includes a housing, an invertible display, and a mounting pedestal connected to the housing. The signal enhancer unit is configured to be installed in different orientations when mounted to support surfaces having different orientations. To accomplish this objective, the signal enhancer unit includes an orientation detector, such as a gravity-operated switch, that is configured to detect the orientation of the signal enhancer and an invertible display that inverts the symbols shown on the display in response to the detected orientation of the signal enhancer unit. This allows the display to be shown right-side-up when the unit is installed right-side-up or upside-down. For this embodiment, the mounting pedestal may be permanently attached to the signal enhancer unit or it may be removably attached to the signal enhancer unit to facilitate installation of the mounting pedestal. In this case, the signal enhancer unit includes a power receptacle and the mounting pedestal comprises a power plug that can be removably received within the receptacle.

In view of the foregoing, it will be appreciated that the present invention provides a mounting pedestal that produces a number of significant advantages over prior mounting systems for wireless repeaters. The specific techniques and structures for implementing this mounting pedestal will become apparent from the following detailed description of the embodiments and the appended drawings and claims.

DETAILED DESCRIPTION

Figure 1C:
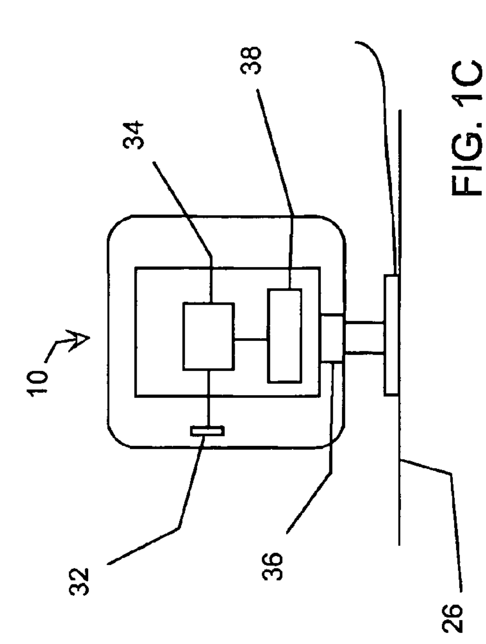
FIGS. 1A-1D are conceptual illustrations showing two embodiments of the cellular signal enhancer and the orientations in which they can be installed on support surfaces, such as upper and lower window casings, having different orientations.

The present invention may be embodied in a relatively low cost, easy to install and aesthetically pleasing cellular signal enhancer suitable for use in a home or business. Several embodiments are shown and described below that each include a mounting pedestal that can swivel to change the direction in which the signal enhancer unit is pointed. The first embodiment includes a removable mounting pedestal that can be plugged into both an upper and a lower receptacle on the signal enhancer unit. This allows the signal enhancer unit to be installed with the same upright orientation when installed on an upper or a lower support surface, for example the bottom or top casing of a window frame. For this embodiment, the mounting pedestal includes a power plug so that the mounting pedestal is removable and can be plugged into the upper or lower receptacles on the signal enhancer unit. Of course, additional receptacles could be included on one or both sides of the signal enhancer unit to accommodate mounting to vertical support services with the signal enhancer unit still installed in its upright orientation. This allows a non-invertible display to be shown in its. upright orientation when the signal enhancer unit is attached to support surfaces with different orientations.

A second embodiment includes a signal enhancer unit with an orientation detector, such as a gravity-operated switch, and an invertible display. This allows the signal enhancer unit to be installed in different orientations, such as right-side-up and upside-down, on support surfaces with different orientations with the display shown right-side-up when the signal enhancer unit is installed in either orientation. Again, the upper and lower casings of a window frame are the prime examples. For this embodiment, the mounting pedestal may be permanently attached to the signal enhancer unit or it may be removable to facilitate installation of the mounting pedestal. For the removable version, the signal enhancer unit includes a power receptacle and the mounting pedestal includes a power plug that can be snapped into the receptacle.

For all of these embodiments, the mounting pedestal has a housing that includes a mounting plate and a cover that provide access for easy installation and adjustment of the swivel of the signal enhancer unit. In addition, the power cable is routed through the housing and exits through on opening between the mounting plate and the cover for an aesthetically pleasing appearance. The power cord could, however, be routed out an opening in a different location if desired. In addition, the swivel for the mounting pedestal includes a cog held in place with a detent mechanism that is accessed and adjusted by removing the pedestal cover. Again, different configurations could be used to obtain a similar result. To reduce costs, the power receptacles are preferably mounted directly on an internal electronics board. But again, this configuration is optional and different electrical connection configurations could be employed to obtain a similar result.

The housing for the mounting pedestal is preferably manufactured from plastic components that can be mass produced cost effectively. In addition, the cellular signal enhancer can be installed with an ordinary drill and screwdriver. Of course, the specific materials and types of fasteners could be changed without affecting the performance of the signal enhancer unit. Although theoretically optional, it is very beneficial to have the same mounting pedestal work for the various embodiments.

Turning now to the drawings, in which like numerals refer to like elements throughout the several figures, FIGS. 1A-1D are conceptual illustrations showing two embodiments of the cellular signal enhancer 10 and the orientations in which they can be installed on support surfaces having different orientations, namely upper and lower window casings. Both embodiments of the cellular signal enhancer include a signal enhancer unit 12, a mounting pedestal 14, and a power cord 16 routed through the housing of the mounting pedestal. Each unit also includes a display 18 or 38 and one or more power receptacles that are directly connected to an internal electronics board 24. As noted previously, the invention may also be implemented with a permanently attached mounting pedestal.

Figure 1D:
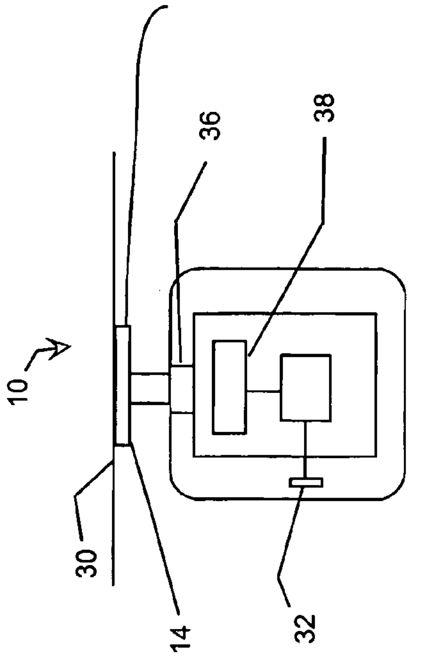
Figure 1A:
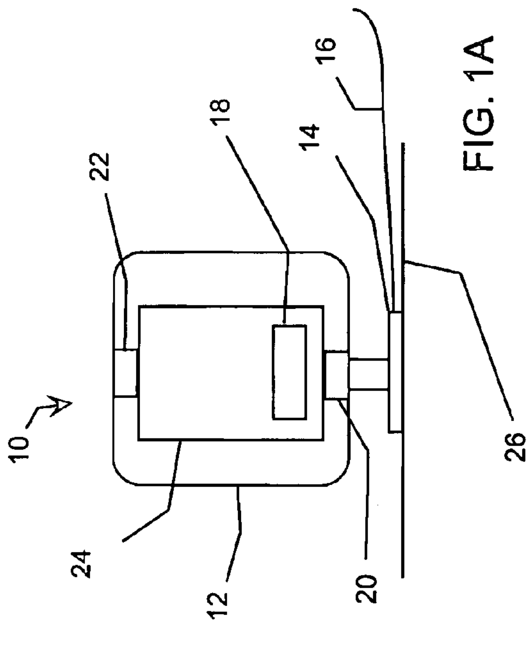
Figure 1B:
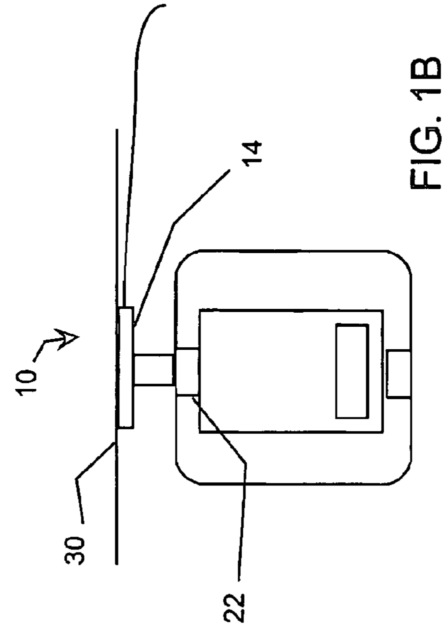

More specifically, the embodiment shown in FIGS. 1A-B includes a non-invertible display 18, a lower power receptacle 20 and an upper power receptacle 22. The mounting pedestal 14 includes a power plug and is removable from the power receptacles on the signal enhancer unit 12. This allows the mounting pedestal 14 to be installed in the upper or lower power receptacles 22, 24 on the signal enhancer unit 12 so that the unit can be installed with the same upright orientation when attached to the lower support surface 26, as shown in FIG. 1A, or to the upper support surface 30, as shown in FIG. 1B.

FIGS. 1C-D shows an alternative embodiment of the cellular signal enhancer 10 that is similar to the embodiment shown in FIGS. 1A-B except that this embodiment includes an orientation detector 32, an invertible display controller 34, and an invertible display 38. The orientation switch 32 may be a gravity operated switch, such as a mercury switch or other suitable device that detects the orientation of the signal enhancer unit 12. Invertible displays and associated controllers are commercially available and any suitable alternative may be used. This configuration allows the signal enhancer unit to be installed in different orientations, such as right-side-up as shown in FIG. 1C or upside-down as shown in FIG. 1D, on support surfaces with different orientations with the display shown right-side-up when the signal enhancer unit is installed in either orientation.

Figure 2:
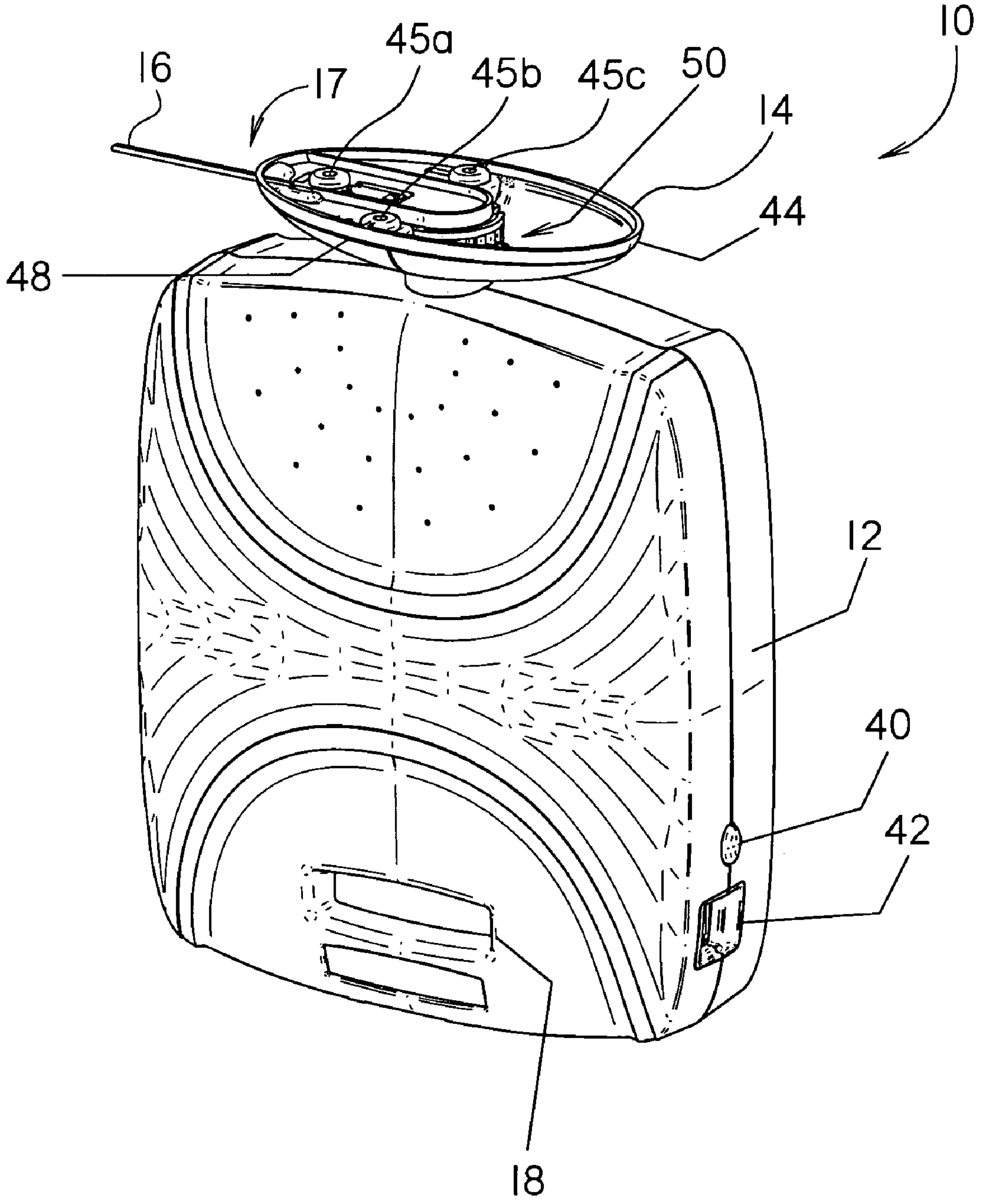
FIG. 2 is a front perspective view of the cellular signal enhancer with the mounting pedestal installed on the upper side of the signal enhancer unit.

FIG. 2 is a front perspective view of the cellular signal enhancer 10 with the mounting pedestal 14 installed on the upper side of the signal enhancer unit 12. The signal enhancer unit includes a band selector button 40 that allows the user to toggle through available frequency bands and sub-bands to tune the unit to the frequency range used by its wireless telephone service provider. The unit also includes a USB port 42 that can be used to communicate with the electronics inside the unit for a variety of purposes including, for example, configuration, troubleshooting, maintenance, gain adjustment, download of software and software parameters, redefinition of the available frequency bands, and so forth. The display 18 shows the band selected and other status information as needed in the configuration and operating modes.

The mounting pedestal 14 includes a mounting plate 44 and a removable cover 48 that allow easy access for installing and changing the swivel direction of the signal enhancer unit with respect to the mounting pedestal. The mounting plate includes three screw holes 45*a-c* that are accessed to install the mounting plate on a support surface, such as the upper or lower casing of a window. The cable 16 extends through the housing of the mounting pedestal and exits through a hole 17 between the mounting plate 44 and one of the covers, in this example the cover 48, at the end of the housing to give the device an aesthetically pleasing appearance. The mounting pedestal 14 also includes a swivel connector 50, which is partially visible in FIG. 2.

Figure 3:
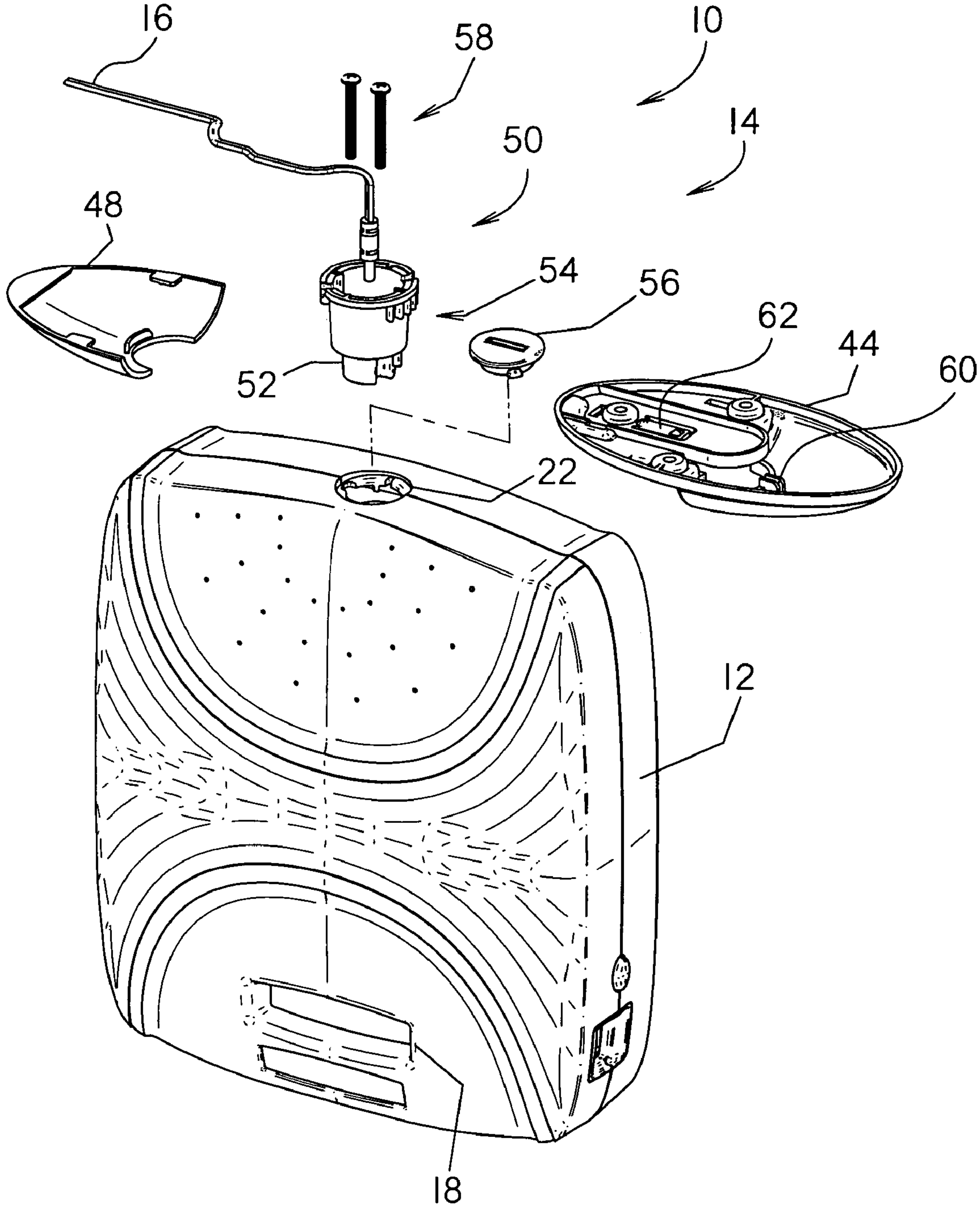
FIG. 3 is a front perspective view of the cellular signal enhancer with an exploded view of the mounting pedestal located on the top side of the signal enhancer unit.
Figure 5:
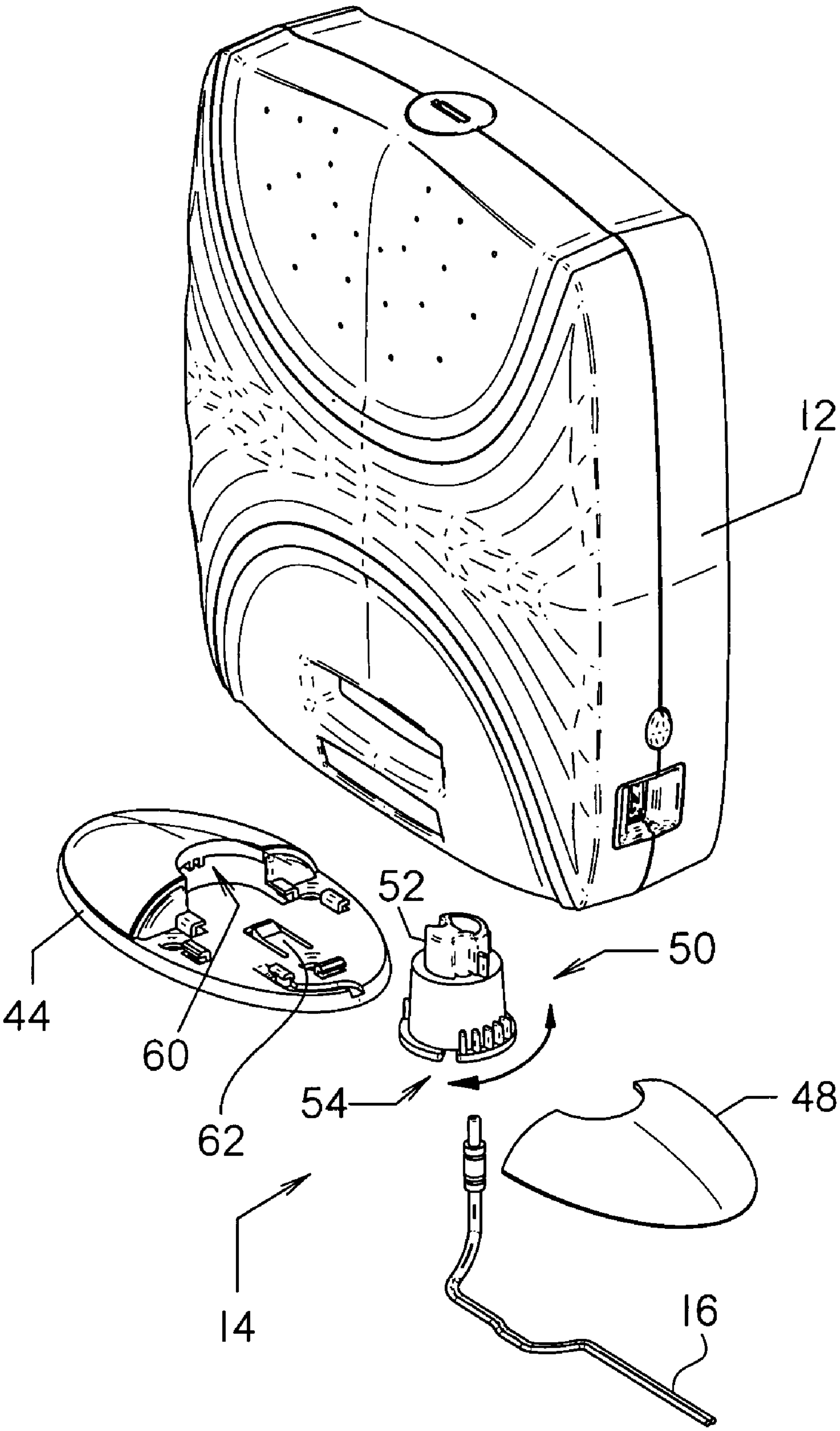
FIG. 5 is a front perspective view of the cellular signal enhancer with an exploded view of the mounting pedestal located on the bottom side of the signal enhancer unit.

FIG. 3 is a front perspective view of the cellular signal enhancer 10 with an exploded view of the mounting pedestal 14 located on the top side of the signal enhancer unit 12. This figure again shows the power cord 16, the mounting plate 44 and the removable cover 48. The swivel connector 50, which includes a power plug 52, fits into the upper power receptacle 22 on the signal enhancer unit 12 when the cover 56 has been removed. The swivel connector 50 includes a cog 54 with teeth that engage opposing teeth 60 on the mounting plate of the mounting pedestal 14, as shown in FIG. 5. Two screws are used to attach the swivel connector 50 to the signal enhancer unit such that the rotational position of the cog 54 can be changed with respect to the opposing teeth 60 to change the swivel angle of the signal enhancer unit 12 with respect to the mounting pedestal 14.

The cellular signal enhancer 10 can be easily installed by attaching the mounting pedestal 14 to the desired support surface, attaching the swivel connector 50 to the signal enhancer unit 12, adjusting the swivel of the unit to the desired direction, and sliding the unit onto the mounting plate 44, which includes a detent mechanism 62 to hold the unit onto the swivel connector. The cover plate 48 is then clipped onto the mounting plate 44 to complete the installation. The swivel direction can be easily changed by removing the cover plate 48, pressing in on the detent mechanism 62 and removing signal enhancer unit 12, mounting plate 44. The cog 54 is then pulled out of engagement with the teeth 60 on the mounting plate 44 and reoriented to the desired rotational position with respect to the mounting plate 44. The signal enhancer unit 12 is then reinstalled on the mounting plate 44 with the new swivel position, and the cover plate 48 is clipped back onto the mounting plate to complete the swivel change.

Figure 4:
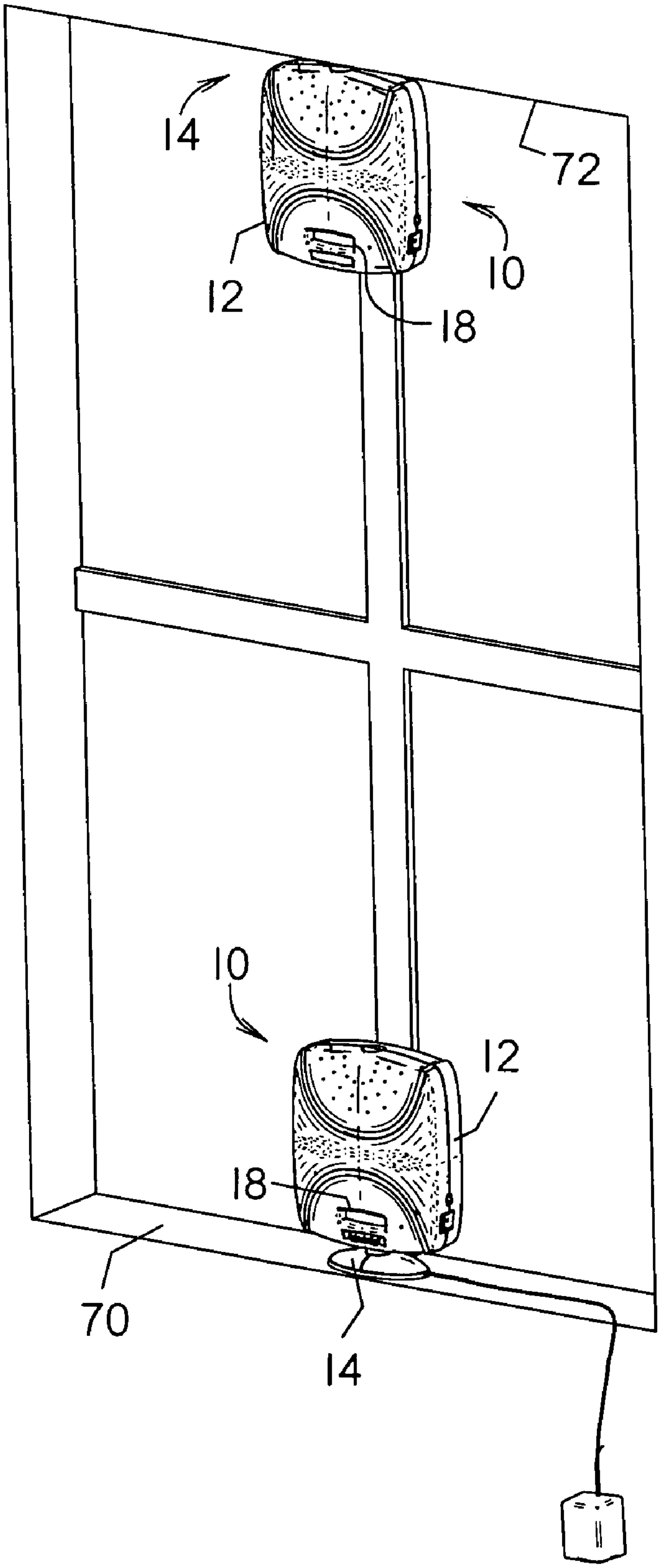
FIG. 4 is a front perspective view of the cellular signal enhancer as installed in the same upright orientation on two support surfaces that have different orientations, an upper and a lower window casing.

FIG. 4 is a front perspective view of the cellular signal enhancer 10 as installed with the same upright orientation on a lower window casing 70 and an upper window casing 72 that have different orientations. This allows the display 18 have the same orientation without being inverted when the unit is supported from above as shown on the top of FIG. 4, or from below as shown on the bottom of FIG. 4. Specifically, cellular signal enhancer 10 is shown as mounted to a lower window sash on the bottom of FIG. 4 and to an upper casing on the top of FIG. 4.

FIG. 5 is a front perspective view of the cellular signal enhancer 10 with an exploded view of the mounting pedestal 14 located on the bottom side of the signal enhancer unit 12. This view shows the same elements previously described with the teeth 60 on the mounting plate 44 shown.

Figure 6:
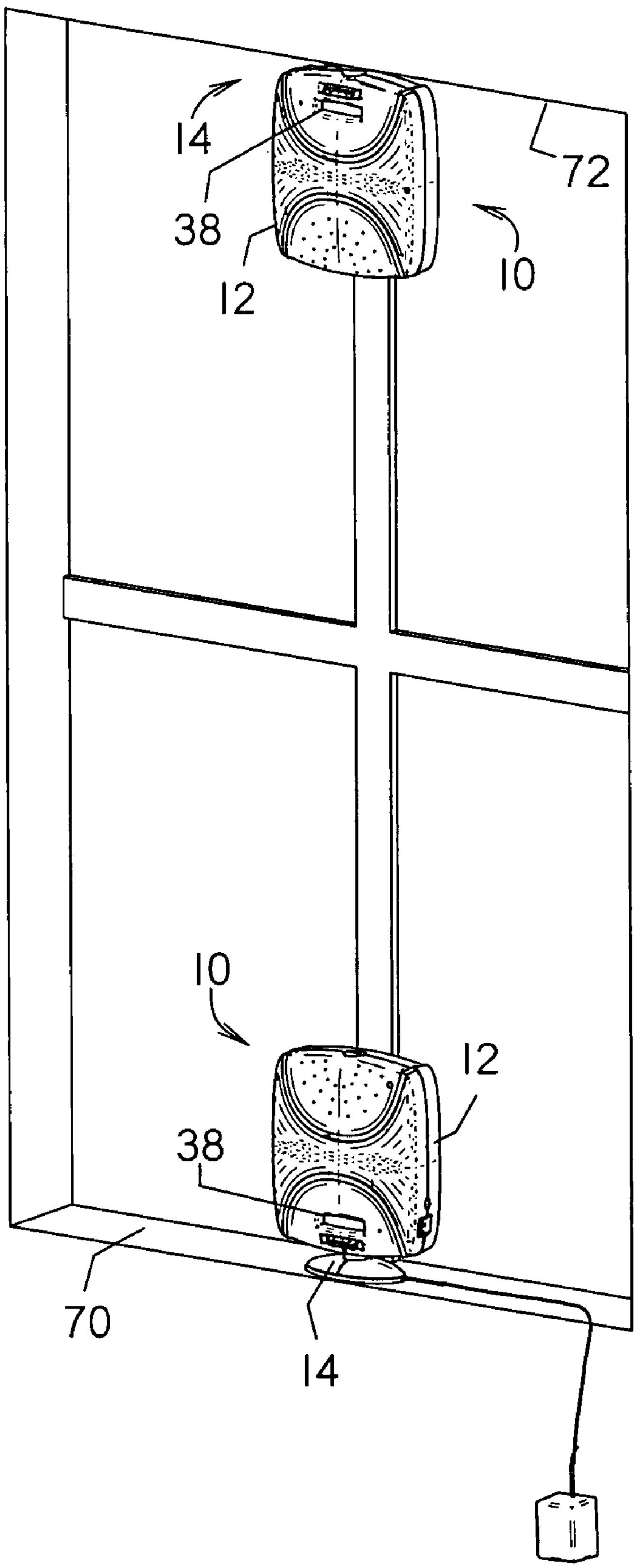
FIG. 6 is a front perspective view of the cellular signal enhancer with an invertible display as installed in different orientations on two support surfaces that have different orientations, again an upper and a lower window sash.

FIG. 6 is a front perspective view of the cellular signal enhancer 10 with an invertible display 38 as installed in different orientations on two support surfaces that have different orientations. A second embodiment includes a signal enhancer unit 12 with an orientation detection switch and an invertible display, as described previously with reference to FIGS. 1C-D. This allows the signal enhancer unit to be installed in different orientations, in this example right-side-up as shown on the bottom of FIG. 6 and upside-down as shown on the bottom of FIG. 6, on support surfaces with different orientations with the invertible display 38, which shows the displayed information right-side-up when the signal enhancer unit is installed to a support surface having either orientation, i.e. above or below the signal enhancer unit 12. Again, the upper and lower casings of a window frame are the prime examples. For this embodiment, the mounting pedestal 14 may be permanently attached to the signal enhancer unit 12 or it may be removably attached to facilitate installation of the mounting pedestal. In this case, the signal enhancer unit includes a power receptacle and the mounting pedestal includes a power plug that can be is removably received within the receptacle, as described for the first embodiment with reference to FIGS. 2-5.

In view of the foregoing, it will be appreciated that present invention provides significant improvements in the mounting system for a cellular signal enhancer. It should be understood that the foregoing relates only to the exemplary embodiments of the present invention, and that numerous changes may be made therein without departing from the spirit and scope of the invention as defined by the following claims.

What is claimed is:

1. A cellular signal enhancer comprising:

a signal enhancer unit configured to be disposed in an upright orientation having an upper power receptacle and a lower power receptacle;

a removable mounting pedestal having a power plug located within a housing and operatively connected to a power cord;

the housing configured to support the signal enhancer unit in the upright orientation from above with the power plug received within the upper power receptacle; and the housing further configured to support the signal enhancer unit in the upright orientation from below with the power plug received within the lower power receptacle.

2. The signal enhancer of claim 1, further comprising a swivel connection between the plug and the housing.

3. The signal enhancer of claim 1, wherein the upper and lower power receptacles are mounted directly to an electronics board within the signal enhancer unit.

4. The signal enhancer of claim 1, wherein the housing comprises a mounting plate and a cover that removably attaches to the mounting plate to facilitate attaching the mounting pedestal to a support surface and changing a swivel angle of the signal enhance unit.

5. The signal enhancer of claim 1, wherein the power cord is routed from the power plug, through the housing, and through an opening between the mounting plate and the cover.

6. The signal enhancer of claim 1, further comprising a swivel connection between the plug and the housing, and wherein:

the housing comprises a mounting plate and a cover that removably attaches to the mounting plate to facilitate attaching the mounting pedestal to a support surface and changing a swivel angle of the signal enhancer unit; and the power cord is routed from the power plug, through the housing, and through an opening between the mounting plate and one of the covers.

7. A removable mounting pedestal for a signal enhancer unit having an upper power receptacle and a lower power receptacle, comprising:

a housing;

a power plug located within the housing and operatively connected to a power cord;

the housing configured to support the signal enhancer unit in the upright orientation from above with the power plug received within the upper power receptacle; and the housing further configured to support the signal enhancer unit in the upright orientation from below with the power plug received within the lower power receptacle.

8. The signal enhancer of claim 7, further comprising a swivel connection between the plug and the housing.

9. The signal enhancer of claim 7, wherein the upper and lower power receptacles are mounted directly to an electronics board within the signal enhancer unit.

10. The signal enhancer of claim 7, wherein the housing comprises a mounting plate and a cover that removably attaches to the mounting plate to facilitate attaching the mounting pedestal to a support surface and changing a swivel angle of the signal enhancer unit.

11. The signal enhancer of claim 7, wherein the power cord is routed from the power plug, through the housing, and through an opening between the mounting plate and one of the covers.

12. The signal enhancer of claim 7, further comprising a swivel connection between the plug and the housing, and wherein:

the housing comprises a mounting plate and a cover that removably attaches to the mounting plate to facilitate attaching the mounting pedestal to a support surface and changing a swivel angle of the signal enhancer unit; and the power cord is routed from the power plug, through the housing, and through an opening between the mounting plate and the cover.

* * * * *